(12) United States Patent
Yang (10) Patent No.: US 8,936,957 B2
(45) Date of Patent: Jan. 20, 2015

(54) LIGHT EMITTING DEVICE WITH PLANAR CURRENT BLOCK STRUCTURE

(71) Applicant: Epistar Corporation, Hsinchu (TW)

(72) Inventor: Tsung-Hsien Yang, Taichung (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/140,043

(22) Filed: Dec. 24, 2013

(65) Prior Publication Data

US 2014/0186976 A1 Jul. 3, 2014

Related U.S. Application Data

(62) Division of application No. 13/399,381, filed on Feb. 17, 2012, now abandoned.

(51) Int. Cl.
| | | |
|---|---|---|
| *H01L 33/00* | (2010.01) | |
| *H01L 33/14* | (2010.01) | |
| *H01L 25/075* | (2006.01) | |
| *H01L 27/15* | (2006.01) | |
| *H01L 33/40* | (2010.01) | |

(52) U.S. Cl.
CPC .......... *H01L 33/0095* (2013.01); *H01L 33/145* (2013.01); *H01L 25/0753* (2013.01); *H01L 27/153* (2013.01); *H01L 33/405* (2013.01); *H03L 33/62* (2013.01); *H01L 2924/0002* (2013.01)
USPC ................ 438/29; 257/E21.24; 257/E33.074; 257/E33.068; 438/31; 438/33

(58) Field of Classification Search
USPC ......... 257/79, 98, E21.24, E33.074, E33.068; 438/29, 31, 33
See application file for complete search history.

(56) References Cited

U.S. PATENT DOCUMENTS

| | | | |
|---|---|---|---|
| 5,906,753 A * | 5/1999 | Aoyagi et al. ................... | 216/24 |
| 8,017,963 B2 | 9/2011 | Donofrio et al. | |
| 2008/0217635 A1 | 9/2008 | Emerson et al. | |
| 2008/0315373 A1 | 12/2008 | Yang | |
| 2009/0273003 A1 | 11/2009 | Park | |
| 2010/0283035 A1 | 11/2010 | Tanaka | |

* cited by examiner

*Primary Examiner* — Minchul Yang
(74) *Attorney, Agent, or Firm* — Bacon & Thomas, PLLC (57) ABSTRACT

The present disclosure discloses a method of manufacturing a light-emitting device comprising the steps of providing a light-emitting wafer having a semiconductor stacked structure and an alignment mark, sensing the alignment mark, and separating the light-emitting wafer into a plurality of light-emitting diodes and removing the alignment mark accordingly.

13 Claims, 7 Drawing Sheets

LIGHT EMITTING DEVICE WITH PLANAR CURRENT BLOCK STRUCTURE

REFERENCE TO RELATED APPLICATION

This application is a divisional application of co-pending U.S. application Ser. No. 13/399,381 filed on Feb. 17, 2012.

TECHNICAL FIELD

The present application relates to a light-emitting device with a current block region, and a method to manufacture the same.

DESCRIPTION OF BACKGROUND ART

In recent years, as the applications of the light-emitting diode increasing, many methods for increasing the light extraction efficiency have been provided. One of the methods is to reduce the electrical current crowding and make the electrical current spread between the electrodes wide. If the electrical current between the electrodes is not uniform and causes the electrical current crowded in some regions, the total light efficiency of the light-emitting diode will decrease.

In recent years, many methods have been provided to improve the light extraction efficiency of the light-emitting diode as the light-emitting diode is applied more widely. However, the current spreading in the light-emitting diode is not uniform so the current distribution is crowded in some areas, and there is a need to improve the light extraction efficiency In order to make the current spreading uniform, a conventional LED structure has a current block region of low electric conductivity in the p-AlGaAs window layer to improve the current spreading and increase the light-emitting efficiency.

Figure 1:
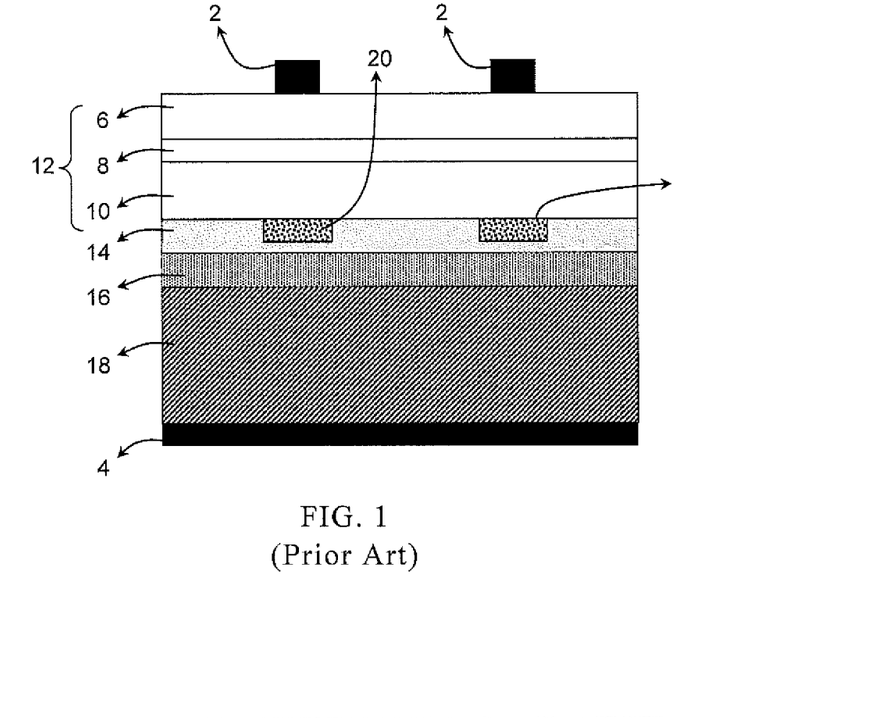
FIG. 1 shows the vertical type LED with the current block region.
Figure 2:
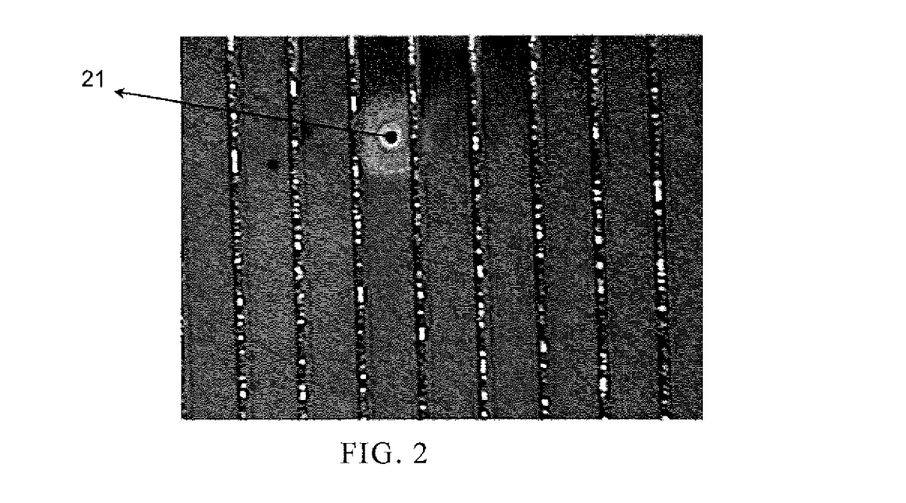
FIG. 2 shows the failed LED due to the high electric field occurring around the corner of the current block region.

Referring to FIG. 1, a vertical type LED comprises a semiconductor stacked layer 12, a reflector layer 14 beneath the semiconductor stacked layer 12, and a conductive substrate 18 bonded to the reflector layer 14 by a bonding layer 16, wherein the semiconductor stacked layer 12 comprises an active layer 8, a first semiconductor layer 6 and a second semiconductor layer 10. A current block region 20 is often disposed in the vertical type LED to improve the current spreading. In general, the current block region 20 is often made of $SiO_2$ and formed by photolithography and etching processes to be disposed in the semiconductor stacked layer 12. But, when the electric current is applied into the vertical type LED, the electrical current may gather around the corners of the current block region 20 to cause the high electric field. When the electric field strength is higher than the limit of the electric field loading of the LED, the LED fails. FIG. 2 shows the failed LED due to the high electric field occurring around the corner of the current block region 20, and a hole 21 is formed on the surface of the failed LED because of the high electric field.

SUMMARY OF THE DISCLOSURE

A light-emitting device comprises a support base having a planar surface, a semiconductor stacked structure disposed on the planar surface, the semiconductor stacked structure comprising a first semiconductor layer, an active layer, a second semiconductor layer, a current block region formed in one of the first semiconductor layer and the second semiconductor layer and physically contacts the planar surface and an electrode disposed on the semiconductor stacked structure.

In another aspect of the present disclosure, a light-emitting device comprises a support base, a plurality of light-emitting units on the support base and a conductive unit electrically connecting the plurality of light-emitting units, wherein each of the plurality of light-emitting unit comprises a semiconductor stacked structure, an electrode disposed on the semiconductor stacked structure, a reflective layer connecting the semiconductor stacked structure, and a current block region in the semiconductor stacked structure, and wherein the reflective layer has a planar surface, and the current block region contacts the planar surface, and wherein the electrode is aligned with the current block region.

A method of manufacturing a light-emitting device comprises the steps of providing a growth substrate, growing a semiconductor stacked structure on the growth substrate, wherein the semiconductor stacked structure comprises an active layer, a first semiconductor layer on the active layer, and a second semiconductor layer under the active layer, defining an alignment mark on the second semiconductor layer, forming a current block region in the semiconductor stacked structure by oxygen plasma treatment, $N_2O$ plasma treatment, argon plasma treatment, ion implantation, or wet oxidation, forming a reflective layer on the second semiconductor layer, bonding a substrate to the reflective layer, removing the growing substrate to expose the first semiconductor layer, and forming an electrode on the first semiconductor layer, wherein the electrode is aligned to the current block region by the alignment marks.

In another aspect of the present disclosure, a method of manufacturing a light-emitting device comprising the steps of providing a light-emitting wafer having a semiconductor stacked structure and an alignment mark, sensing the alignment mark, and separating the light-emitting wafer into a plurality of light-emitting diodes and removing the alignment mark accordingly.

DETAILED DESCRIPTION OF PREFERRED EMBODIMENTS

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 3:
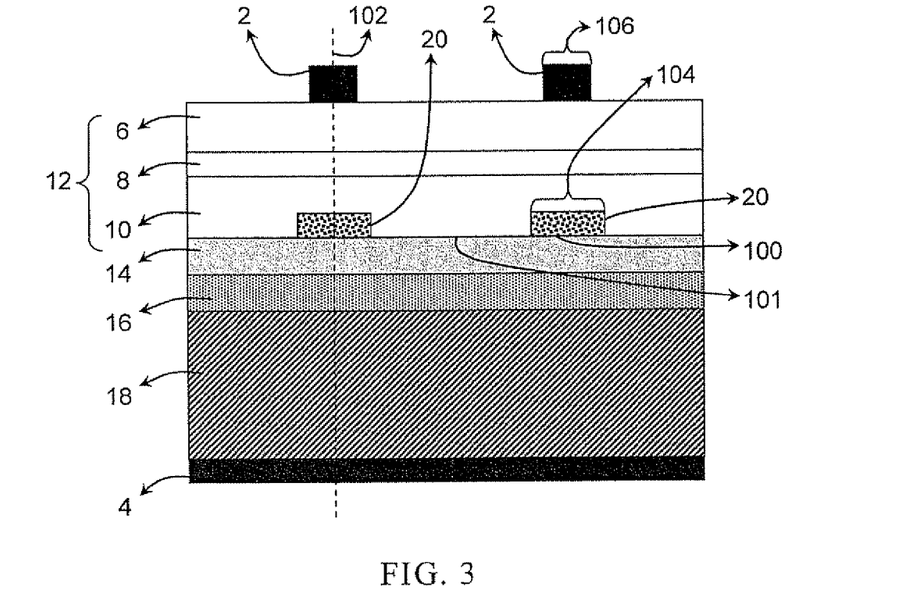
FIG. 3 shows the cross-sectional view of a vertical type light-emitting diode with one current block region in the semiconductor stacked layer according to the first embodiment of the present application.

FIG. 3 is the cross-sectional view of a vertical type light-emitting diode with a plurality of current block regions 20 in the semiconductor stacked layer 12 according to the first embodiment of the present application. The vertical type light-emitting diode has a plurality of upper electrodes 2 ohmically contacted with the semiconductor stacked layer 12. The semiconductor stacked layer 12 includes a first semiconductor layer 6, an active layer 8, and a second semiconductor layer 10. The first semiconductor layer 6 may be an n-type semiconductor and the second semiconductor layer 10 may be a p-type semiconductor, or vice versa. The material of the first semiconductor layer 6, the active layer 8, and the second semiconductor layer 10 can be a compound which includes at least one substance chosen from Ga, Al, In, P, N, Zn, Cd, and Se. When the electrical current applies to the semiconductor stacked layer 12, the active layer 8 can emit light with a wavelength of from 400 nm to 650 nm depending on the composition of the material. For example, when the material of the active layer is AlGaInP series, it can emit red light, and when the material of the active layer is AlGaInN series, it can emit blue light. There is a reflector layer 14 beneath the semiconductor stacked layer 12. The reflector layer 14 can reflect the light emitted from the active layer 8 to improve the light extracting efficiency of the light-emitting diode. The reflector layer 14 can be made of the electrically conductive and high reflective material, such as Al, Au, Pt, Ag, Rh, Ir, or the combination thereof. A conductive substrate 18 is bonded to the reflector layer 14 by the bonding layer 16. The bonding layer 16 can be electrically conductive, and the material of the bonding layer can be ITO, InO, SnO, CTO, ATO, AZO, ZTO, ZnO, AlGaAs, GaN, GaP, GaAs, GaAsP, etc.

Each of the plurality of the current block regions 20 is formed in the semiconductor stacked layer 12 and directly contacts with the reflector layer 14. The first contact surface 100 between the reflector layer 14 and the current block regions 20 and the second contact surface 101 between the reflector layer 14 and the semiconductor stacked layer 12 are coplanar. Each of the current block regions 20 can be formed by ion implantation, oxygen plasma treatment, $N_2O$ plasma treatment, argon plasma treatment, or wet oxidation. The material of the current block regions can have an electric conductivity less than one-tenth of the electric conductivity of the semiconductor material of the semiconductor stacked layer 12 around the current block regions 20, or be an insulated oxide, such as $SiO_2$, $TiO_2$, or $SiN_x$. While the electrical current disperses through the second contact surface 101, the high electrical field does not happen and the light-emitting diode does not fail.

Each of the current block regions 20 corresponds to each of the upper electrodes 2 respectively and the thickness of each of the current block regions 20 is greater than 50 Å. In other words, a virtual central normal line 102 of each of the upper electrodes 2 extends to pass the corresponding current block region 20. The width 104 of each of the current block regions 20 is greater than the width 106 of the corresponding upper electrode 2 to make the electric current spreading wilder between the upper electrodes 2 and the lower electrode 4.

Figure 4:
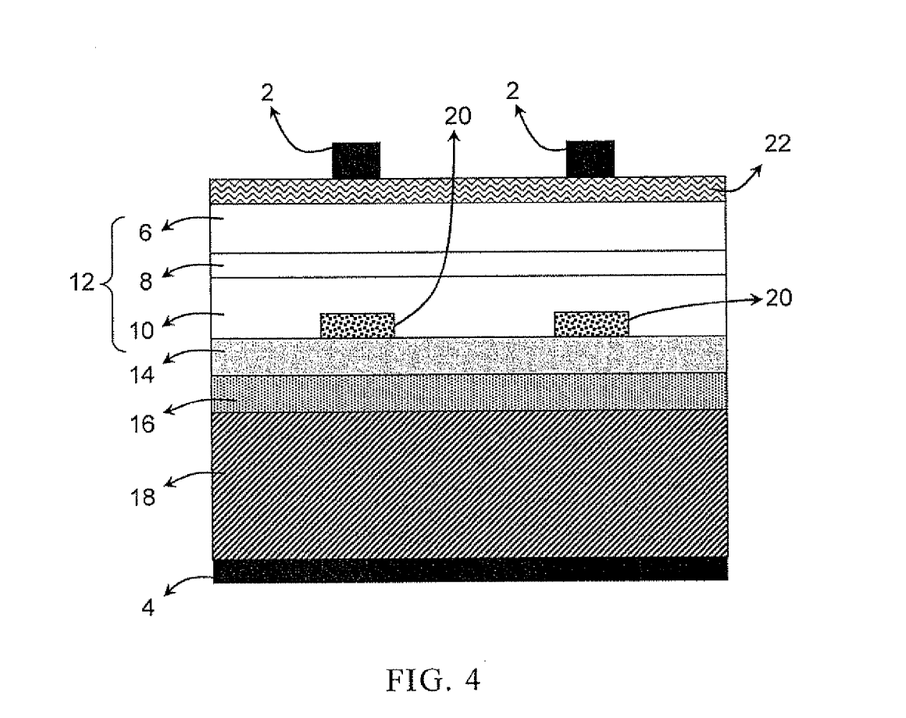
FIG. 4 shows the cross-sectional view of a vertical type light-emitting diode with one current block region in the semiconductor stacked layer according to the second embodiment of the present application.
Figure 5A:
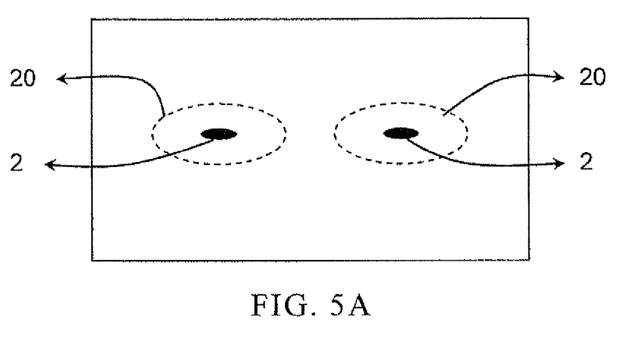
FIGS. 5A to 5D show the top view of the vertical type light-emitting diode according to the first embodiment and the second embodiment.
Figure 5B:
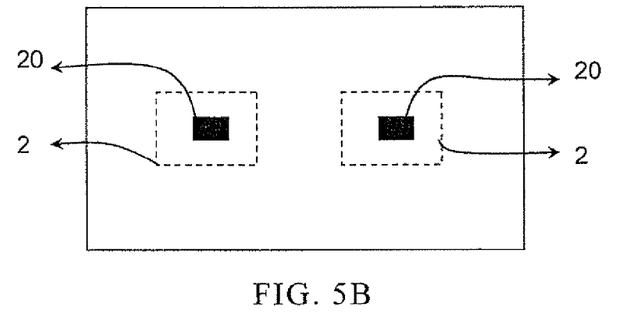
Figure 5C:
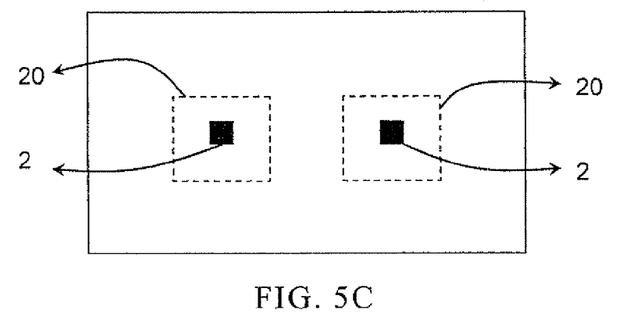
Figure 5D:
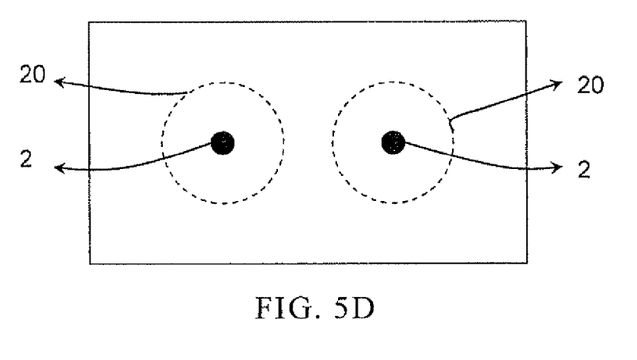

FIG. 4 is the cross-sectional view of a vertical type light-emitting diode with a plurality of current block regions 20 in the semiconductor stacked layer 12 according to the second embodiment of the present application. The difference between the second embodiment and the first embodiment is that the vertical type light-emitting diode has a transparent conductive layer 22 between the upper electrodes 2 and the semiconductor stacked layer 12. The transparent conductive layer 22 can enhance the spread of the electric current. The material of the transparent conductive layer 22 can be ITO, InO, SnO, CTO, ATO, ZnO, GaP, etc.

FIGS. 5A to 5D are the top view of the vertical type light-emitting diode according to the aforementioned two embodiments. The shape of the current block region 20 can be a circle, a square, a rectangle, an ellipse, or any combination thereof. Generally, the shape of the current block region 20 is similar to the shape of the upper electrode 2.

FIGS. 6A to 6I show the process of producing the vertical type light-emitting diode with a plurality of current block regions 20 in the semiconductor stacked layer 12.

Figure 6A:
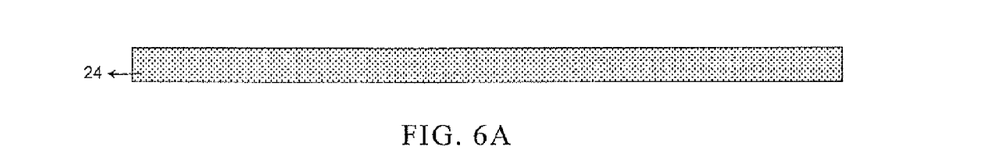
FIGS. 6A to 6I show the process of producing the vertical type light-emitting diode with one current block region in the semiconductor stacked layer.
Figure 6B:
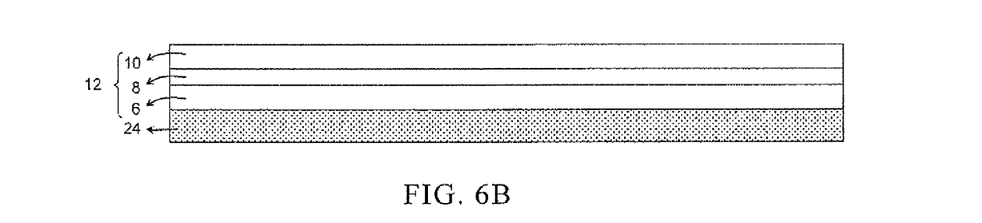
Figure 6C:
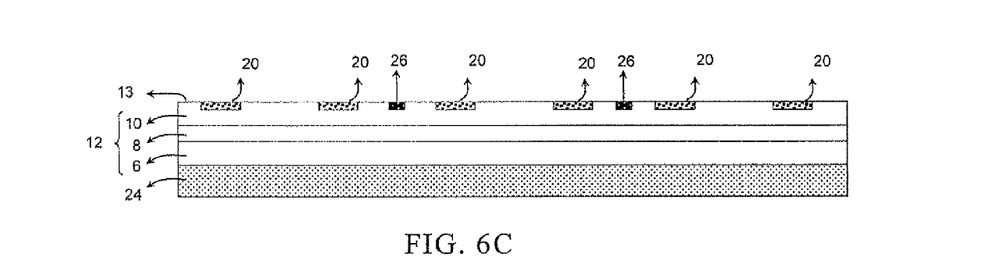
Figure 6D:
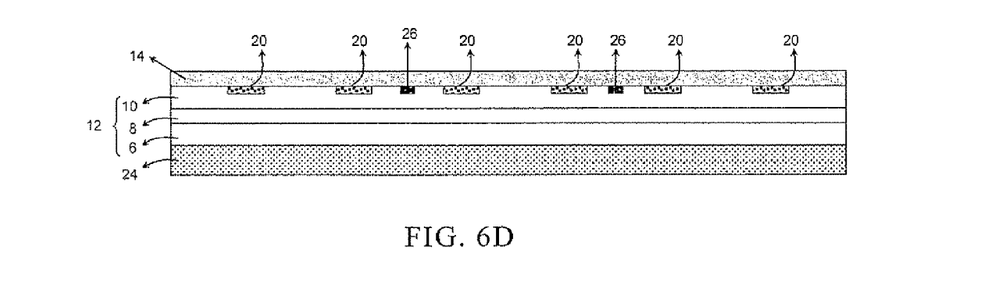
Figure 6E:
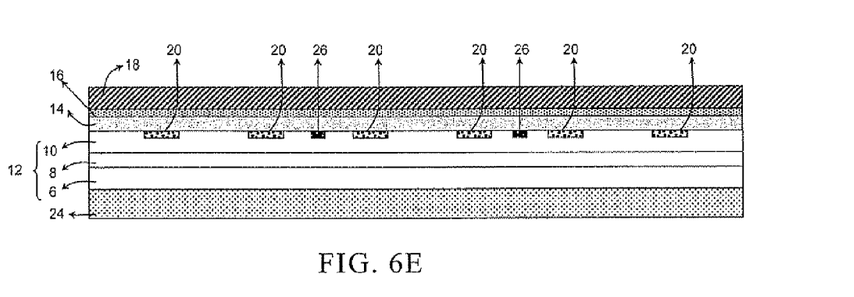
Figure 6F:
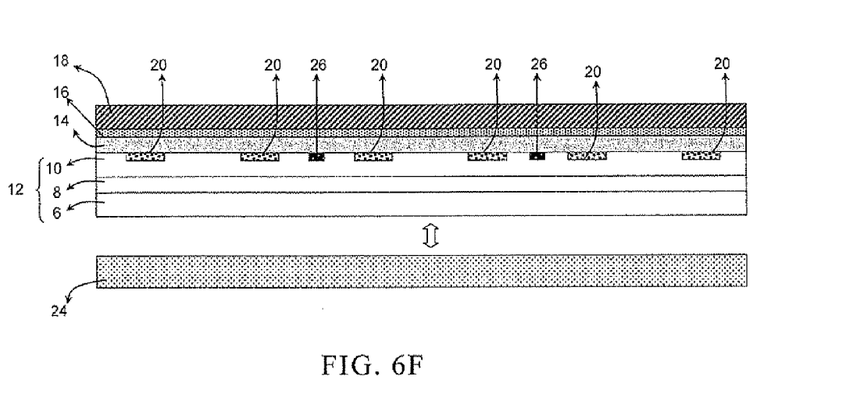
Figure 6G:
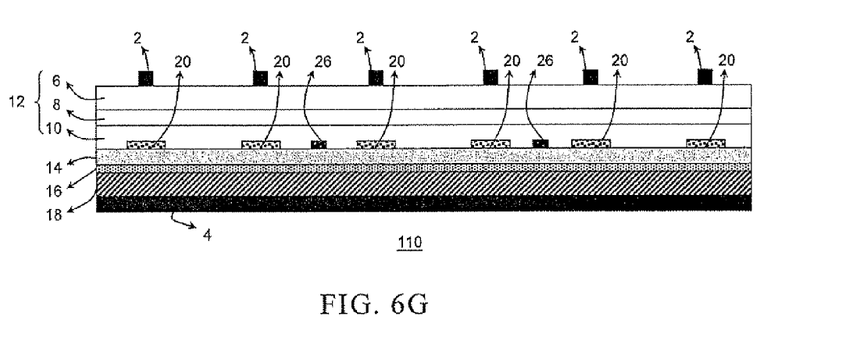
Figure 6H:
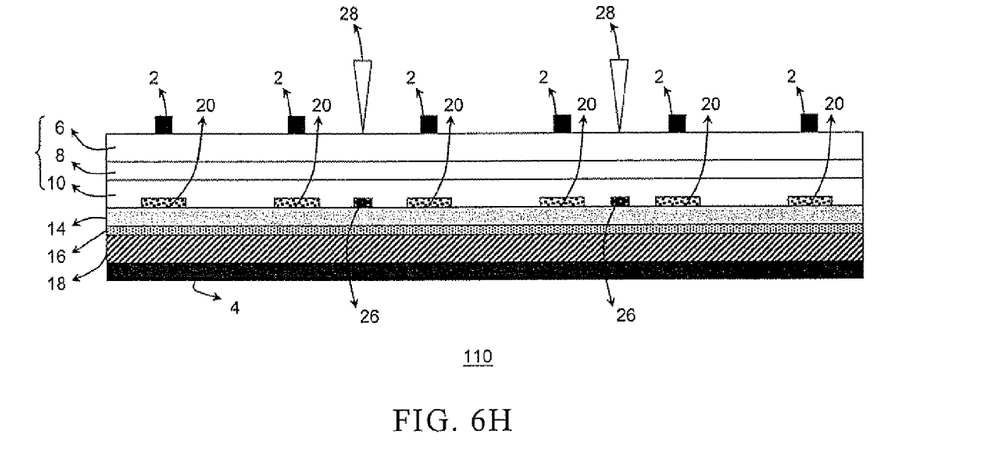
Figure 6I:
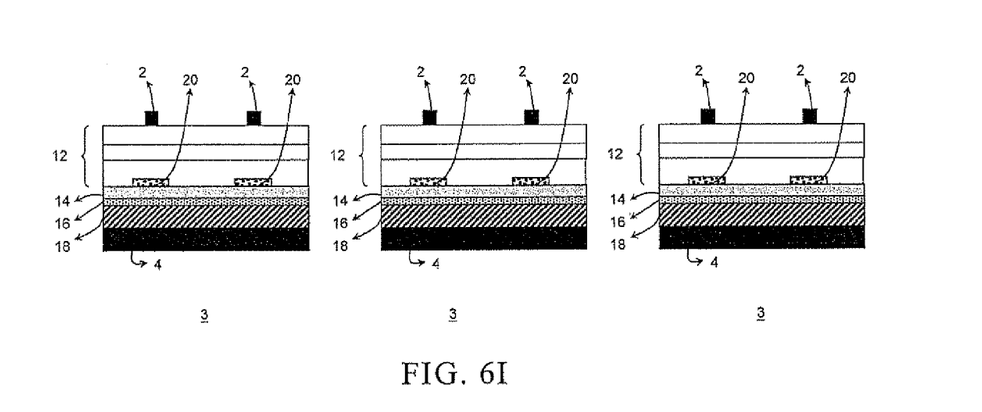

FIG. 6A shows the step of providing a growing substrate 24. The material of the growing substrate 24 can be sapphire, SiC, GaN, GaAs, GaP, etc. Then, as FIG. 6B shows, a semiconductor stacked layer 12 is grown on the growing substrate 24. The semiconductor stacked layer 12 comprises an active layer 8, a first semiconductor layer 6 and a second semiconductor layer 10. The first semiconductor layer 6, the active layer 8, and the second semiconductor layer 10 are grown in sequence. The first semiconductor layer 6 and the second semiconductor layer 10 have different conductivity type. The first semiconductor layer 6 may be an n-type semiconductor and the second semiconductor layer 10 may be a p-type semiconductor, or vice versa. In the next step, as FIG. 6C shows, the current block regions 20 and alignment marks 26 are formed in the second semiconductor layer 10. The current block regions 20 can be formed by oxygen plasma treatment, $N_2O$ plasma treatment, argon plasma treatment, ion implantation, or wet oxidation and are not covered by the second semiconductor layer 10, and a first surface 13 of the second semiconductor layer 10 which is planar is formed. The alignment marks 26 are opaque and indicate the region without forming the light-emitting diodes. When the semiconductor stacked layer 12 is flipped upside down, the alignment marks 26 can be used for alignment from the back side of the semiconductor stacked layer 12 in sequent steps. In the next step, as FIG. 6D shows, a reflector layer 14 is formed on the semiconductor stacked layer 12. The reflector layer 14 is electrically conductive and reflective, and the material of the reflector layer 14 can be Al, Au, Pt, Ag, Rh, Ir, or the combination thereof. In the next step, as FIG. 6E shows, a conductive substrate 18 is bonded to the reflector 14 by the bonding layer 16. The bonding layer 16 is electrically conductive. The material of the bonding layer 16 can be ITO, InO, SnO, CTO, ATO, AZO, ZTO, ZnO, AlGaAs, GaN, GaP, GaAs, GaAsP, etc. In the next step, as the FIG. 6F shows, the growing substrate 24 is separated from the semiconductor stacked layer 12. In the next step, as shown in FIG. 6G, the light emitting wafer 110 is flipped upside down. The upper electrodes 2 are formed on first semiconductor layer 6 and the lower electrode 4 is formed on the other surface of the conductive substrate 18. The positions of the upper electrodes 2 are determined by sensing the positions of the alignment marks 26. If the upper electrodes 2 do not align the alignment marks 26, the upper electrodes 2 cannot align the current block regions 20 and the current spreading is poor. Then, as shown in FIG. 6H, the light emitting wafer 110 is separated to form a plurality of light-emitting diodes 3 shown in the FIG. 6I, and the alignment marks 26 are removed during the separation of the light emitting wafer 110.

Figure 7:
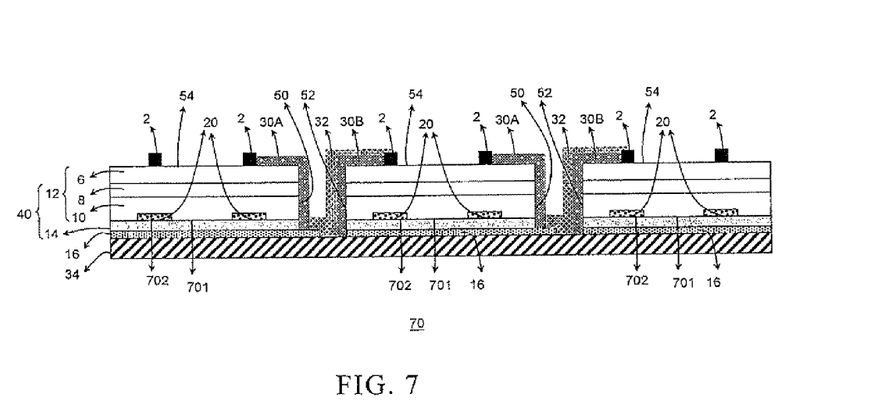
FIG. 7 shows a high voltage light-emitting device formed by the vertical type light-emitting diodes according to the third embodiment of the present application.

Further, the aforementioned vertical type light-emitting diodes can be connected in series to form a high voltage light-emitting device. FIG. 7 shows a high voltage light-emitting device 70 formed by the vertical type light-emitting diodes 40, which has one current block region 20, connected in series according to the third embodiment of the present application. Each of the light-emitting diode 40 comprises a semiconductor stacked layer 12, a reflector layer 14, at least one upper electrode 2 on the semiconductor stacked layer 12. The current block regions 20 are formed in the semiconductor stacked layer 12 and contact the reflector layer 14. The first contact surface 702, which connects the reflector layer 12 and the current block regions 20, and the second contact surface, which connects the reflector layer 12 and the semiconductor stacked layer 12, are coplanar. The semiconductor stacked layer 12 includes a first semiconductor layer 6, an active layer 8 and a second semiconductor layer 10. The first semiconductor layer 6 and the second semiconductor layer 10 have different conductivity type. The first semiconductor layer 6 may be an n-type semiconductor and the second semiconductor layer 10 may be a p-type semiconductor, or vice versa. The material of the first semiconductor layer 6, the active layer 8, and the second semiconductor layer 10 can be a compound which includes at least one substance chosen from Ga, Al, In, P, N, Zn, Cd, and Se. When the electrical current applies to the semiconductor stacked layer 12, the active layer 8 can emit light with a wavelength of from 400 nm to 650 nm depending on the composition of the material. For example, when the material of the active layer 8 is AlGaInP series, it can emit red light, and when the material of the active layer 8 is AlGaInN series, it can emit blue light. The reflector layer 14 can reflect the light emitted from the active layer 8 to improve the light extracting efficiency of the light-emitting diode. The reflector layer 14 can be made of the electrically conductive and reflective material, such as Al, Au, Pt, Ag, Rh, Ir, or the combination thereof. The plurality of light-emitting diodes 40 are bonded to the insulated substrate 34 by the bonding layer 16. The bonding layer 16 can be electrically conductive, and the material of the bonding layer can be ITO, InO, SnO, CTO, ATO, AZO, ZTO, ZnO, AlGaAs, GaN, GaP, GaAs, GaAsP, etc. The material of the insulated substrate 34 can be glass, sapphire, AlN, ceramic, etc. The first side wall 50 and the second side wall 52 between any two of the light-emitting diodes 40 are covered by the first insulation layer 30A and the second insulation layer 30B respectively. The first insulation layer 30A and the second insulation layer 30B also cover a portion of the upper surface 54 of each of the light-emitting diodes 40. The bonding layer 16 protrudes from the first side wall 50 and is uncovered by the first insulation layer 30A. Between any two light-emitting diodes 40, there is a bridge metal 32 electrically connect the bonding layer 16 of one of two light-emitting diodes 40 with the upper electrodes 2 of the other light-emitting diode 40. For any two electrically connected light-emitting diodes 40, the bridge metal 32 is isolated from each of the semiconductor stacked layers 12 and each of the reflector layers 14 by the first insulation layer 30A and the second insulation layer 30B.

Figure 8:
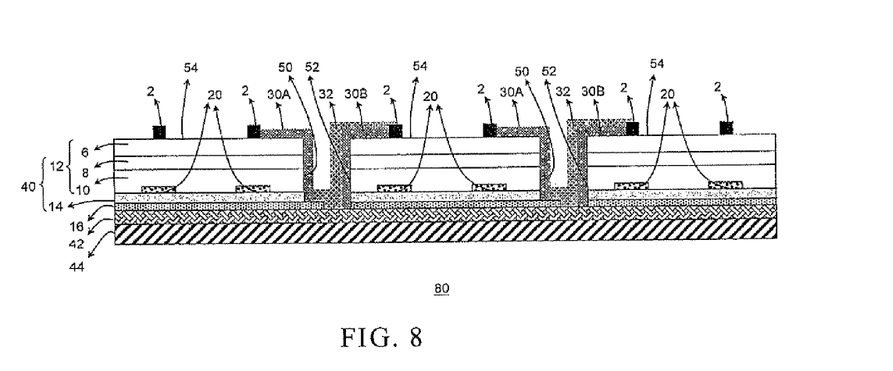
FIG. 8 shows a high voltage light-emitting device formed by the vertical type light-emitting diodes according to the fourth embodiment of the present application.

FIG. 8 shows a high voltage light-emitting device 80 formed by the vertical type light-emitting diodes 40, which has one current block region 20, connected in series according to the fourth embodiment of the present application. The difference between the preceding light-emitting device 70 and the light-emitting device 80 is that there is an insulating layer 42 between the bonding layers 16 and the substrate 44. The insulating layer 42 can be formed by spin coating, printing, or molding glue filling, and the material of the insulating layer 42 can be spin-on-glass, silicone resin, BCB, epoxy, polyimide or PFCB. The material of the substrate 44 can be electrically conductive material, such as metal or metal alloy like Cu, Al, Sn, Zn, Cd, Ni, Co, W, Mo, or the combination thereof, or electrically insulating material, such as sapphire, diamond, glass, polymer, epoxy, quartz, acryl, AlN, etc.

Figure 9:
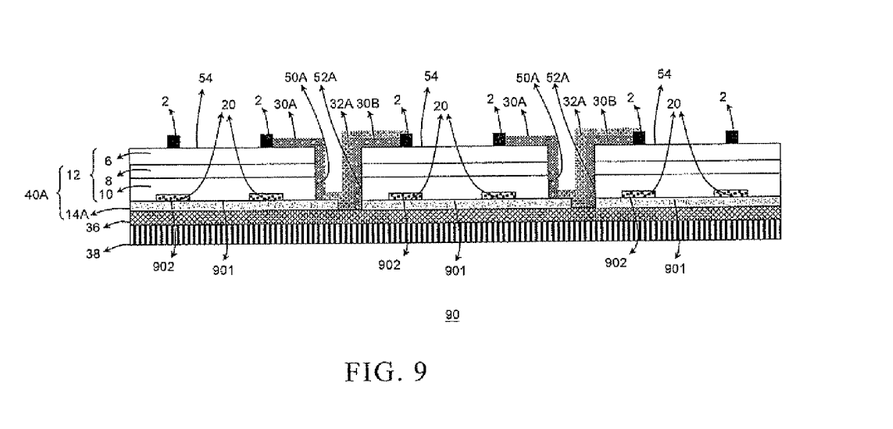
FIG. 9 shows a high voltage light-emitting device formed by the vertical type light-emitting diodes according to the fifth embodiment of the present application.

FIG. 9 shows a high voltage light-emitting device 90 formed by the vertical type light-emitting diodes 40A, which has at least one current block region 20, connected in series according to the fifth embodiment of the present application. Each of the light-emitting diode 40A includes a semiconductor stacked layer 12, a reflector layer 14A, and at least one upper electrode 2 on the semiconductor stacked layer 12. The current block regions 20 are formed in the semiconductor stacked layer 12 and exposed from the semiconductor stacked layer 12 to contact the reflector layer 14A. The first contact surface 902, which connects the current block region 20 and the reflector layer 14A, and the second contact surface, which connects the current block regions 20 and the reflector layer 14A, are coplanar. The semiconductor stacked layer 12 includes a first semiconductor layer 6, an active layer 8, and a second semiconductor layer 10. The first semiconductor layer 6 and the second semiconductor layer 10 have different conductivity type. The first semiconductor layer 6 may be an n-type semiconductor and the second semiconductor layer 10 may be a p-type semiconductor, or vice versa. The material of the first semiconductor layer 6, the active layer 8, and the second semiconductor layer 10 can be a compound which includes at least one substance chosen from Ga, Al, In, P, N, Zn, Cd, and Se. When the electrical current applies to the semiconductor stacked layer 12, the active layer 8 can emit light with a wavelength of from 400 nm to 650 nm depending on the composition of the material. For example, when the material of the active layer 8 is AlGaInP series, it can emit red light, and when the material of the active layer 8 is AlGaInN series, it can emit blue light. The reflector layer 14A can reflect the light emitted from the active layer 8 to improve the light extracting efficiency of the light-emitting diode. The reflector layer 14A can be made of the electrically conductive and high reflective material, such as Al, Au, Pt, Ag, Rh, Ir, or the combination thereof. The light-emitting diodes 40 are bonded to the substrate 38 by the insulating bonding layer 36. The material of the insulating bonding layer 36 includes spin-on-glass, silicone resin, BCB, epoxy, polyimide, or PFCB. The material of the substrate 38 can be electrically conductive material, such as metal or metal alloy like Cu, Al, Sn, Zn, Cd, Ni, Co, W, Mo, or the combination thereof, or electrically insulating material, such as sapphire, diamond, glass, polymer, epoxy, quartz, acryl, AlN, etc.

Between any two light-emitting diodes 40A, the first insulation layer 30A and the second insulation layer 30B cover the first side wall 50A, the second side wall 52A respectively and a portion of the upper surface 54. For each of the light-emitting diode 40A, the reflector layer 14A protrudes from the first side wall 50 and is uncover by the first insulation layer 30A. For any two light-emitting diodes 40, a bridge metal 32A, which is disposed between the two light-emitting diodes 40A, connects the reflector layer 14A of one of the two light-emitting diodes 40A with the upper electrode 2 of the other light-emitting diode 40A. For any two electrically connected light-emitting diodes 40A, the bridge metal 32A is isolated from each of the semiconductor stacked layers 12 and each of the reflector layers 14A by the first insulation layer 30A and the second insulation layer 30B.

The light-emitting device or light-emitted diode mentioned above may be mounted with the substrate onto a submount via a solder bump or a glue material to form a light-emitting apparatus. Besides, the submount further comprises one circuit layout electrically connected to the electrode of the light-emitting device via an electrical conductive structure, such as a metal wire.

What is claimed is:

1. A method of manufacturing a light-emitting device comprising the steps of:
    providing a light-emitting wafer having a semiconductor stacked structure and an alignment mark;
    sensing the alignment mark; and
    separating the light-emitting wafer into a plurality of light-emitting diodes, and removing the alignment mark accordingly;
    wherein forming the light-emitting wafer comprises the steps of:
    providing a growth substrate;
    forming the semiconductor stacked structure;
    forming the alignment mark on the semiconductor stacked structure
    forming a reflective layer on the alignment mark and the semiconductor stacked structure;
    providing a bonding substrate;
    bonding the reflective layer to the bonding substrate by a bonding layer; and
    removing the growth substrate to expose the semiconductor stacked structure.

2. A method according to claim 1, wherein providing the light-emitting wafer comprises the steps of:
    forming a current block region in the semiconductor stacked structure.

3. A method according to claim 2, further comprising:
    forming an electrode on the exposed the semiconductor stacked structure and aligned to the current block region by sensing the alignment mark.

4. A method according to claim 2, wherein the current block region is formed by plasma treatment, ion implantation, or wet oxidation.

5. A method according to claim 3, wherein a width of the current block region is greater than a width of the electrode.

6. A method according to claim 1, wherein the reflective layer comprises an electrically conductive and reflective material.

7. A method according to claim 1, wherein the bonding layer is electrically conductive.

8. A method according to claim 1, wherein the alignment mark and the current block region are coplanar.

9. A method of manufacturing a light-emitting device according to claim 1, wherein the alignment mark is between the bonding substrate and the semiconductor stacked structure when sensing the alignment mark.

10. A method according to claim 1, wherein the alignment mark is opaque.

11. A method according to claim 1, wherein the light-emitting wafer is separated at a position of the alignment mark such that the alignment mark is removed.

12. A method of manufacturing a light-emitting device comprising the steps of:
    providing a light-emitting wafer having a semiconductor stacked structure and an alignment mark;
    sensing the alignment mark; and
    separating the light-emitting wafer into a plurality of light-emitting diodes, and removing the alignment mark accordingly;
    wherein forming the light-emitting wafer comprises the steps of:
    providing a growth substrate;
    forming the semiconductor stacked structure and a current block region therein; and
    forming the alignment mark on the semiconductor stacked structure,
    wherein the semiconductor stacked structure comprises a first semiconductor layer, a second semiconductor layer, and an active layer between the first semiconductor layer and the second semiconductor layer.

13. A method according to claim 12, wherein the current block region does not pass through the active layer.

* * * * *